United States Patent [19]

Bressel et al.

[11] Patent Number: 5,693,209

[45] Date of Patent: *Dec. 2, 1997

[54] PROCESS FOR METALLIZATION OF A NONCONDUCTOR SURFACE

[75] Inventors: Burkhard Bressel; Heinrich Meyer; Walter Meyer; Klaus Gedrat, all of Berlin, Germany

[73] Assignee: Atotech Deutschland GmbH, Berlin, Germany

[*] Notice: The term of this patent shall not extend beyond the expiration date of Pat. No. 5,183,552.

[21] Appl. No.: 518,575

[22] Filed: Aug. 23, 1995

Related U.S. Application Data

[63] Continuation of Ser. No. 899,489, Jun. 16, 1992, abandoned, which is a continuation of Ser. No. 655,789, Feb. 14, 1991, Pat. No. 5,183,552, which is a continuation-in-part of Ser. No. 583,961, Sep. 14, 1990, abandoned.

[30] Foreign Application Priority Data

Sep. 14, 1989 [DE] Germany ............... 39 31 003.5
Dec. 5, 1989 [DE] Germany ............... 39 40 565.6

[51] Int. Cl.⁶ ................................................ C25D 5/56
[52] U.S. Cl. ........................ 205/166; 205/183; 205/125; 205/920
[58] Field of Search ................................ 205/125, 920, 205/183, 163, 166

[56] References Cited

U.S. PATENT DOCUMENTS 4,567,250  1/1986  Naarmann et al. ............... 252/500
4,869,949  9/1989  Muenstedt ............... 204/242
5,183,552  2/1993  Bressel et al. ............... 205/158

FOREIGN PATENT DOCUMENTS

WO89/08375  9/1989  WIPO .

*Primary Examiner*—Kathryn L. Gorgos
*Assistant Examiner*—Kishor Mayekar
*Attorney, Agent, or Firm*—Cohen, Pontani, Lieberman & Pavane

[57] ABSTRACT

The process for directly metallizing a circuit board having nonconductor surfaces, includes reacting the nonconductor surface with an alkaline permanganate solution to form manganese dioxide chemically adsorbed on the nonconductor surface; forming an aqueous solution of a weak acid and of pyrrole or a pyrrole derivative and soluble oligomers thereof; contacting the aqueous solution containing the pyrrole monomer and its oligomers with the nonconductor surface having the manganese dioxide adsorbed chemically thereon to deposit an adherent, electrically conducting, insoluble polymer product on the nonconductor surface; and directly electrodepositing metal on the nonconductor surface having the insoluble adherent polymer product formed thereon. The oligomers are advantageously formed in aqueous solution containing 0.1 to 200 g/l of the pyrrole monomer at a temperature between room temperature and the freezing point of the solution.

11 Claims, No Drawings

PROCESS FOR METALLIZATION OF A NONCONDUCTOR SURFACE

This is a continuation of application Ser. No. 07/899,489, filed Jun. 16, 1992, now abandoned, which is a continuation of Ser. No. Jul. 07/655,789, filed Feb. 14, 1991, now U.S. Pat No. 5,183,552, which is a CIP of Ser. No. 07/583,961, filed Sep. 14, 1990 now abandoned. Reference is also made to copending U.S. patent application Ser. No. 07/694,422, filed May 1, 1991. The invention also relates to the products of the process for metallization of nonconductor surfaces.

BACKGROUND OF THE INVENTION

Our present invention relates to a process for direct metallization of a nonconductor.

Coatings or layers on nonconductors, which are made of electrically conductive heterocyclic polymers, are known in themselves. These heterocyclic polymer coatings or layers are described in German Patent 3,520,980, German Patent 3,132,218 and 3,535,709 as well as European Patent 0,206,133. A polypyrrole coating or layer can be formed on a nonconductor from a monomeric pyrrole using a strong oxidizing agent. These conducting nonconductors form the basis of the subject matter of the present application.

The use of polymers with an intrinsic electrical conductivity, which are formed from a monomer and a strong oxidizing agent, for making the electrical through-going contacts in circuit boards, is described in an additional German Patent Document(DE 3,806,884 C1).

The use of the methods of EP 0,206,133 and German Patent 3,806,884 require use of a strong acid and a strong oxidizing agent. These methods also require a high degree of technical engineering skill, so that the range of practical usages, in which the desired results are obtained, is very narrow.

Undesirable side reactions of heterocyclics being used also occur, since pyrroles are especially easily polymerized by light or acid. The acids have the power to form an insoluble black precipitate from the polypyrrole formed from the monomers in a short time. This precipitate is amorphous and cannot be processed further.

SUMMARY AND DESCRIPTION OF THE INVENTION

It is an object of the present invention to provided a method, in which a soluble, nonconductive substance selected from the group consisting of 5-membered-ring-containing heterocyclic monomers, oligomers derived from these monomers and mixtures thereof is converted into an electrically conductive polymer with a mild oxidizing agent using only one process step and only a single solution.

According to our invention an adherent,insoluble polymer product is formed on a surface of a nonconductor in a single process step from an aqueous solution of a nonconducting substance selected from the group consisting of 5-membered-ring-containing heterocyclic monomers, oligomers derived therefrom and mixtures thereof with a oxidizing agent adsorbed on the nonconductor. The oxidizing agent is adsorbed on the surface of the nonconductor and then the aqueous solution contacts the surface having the adsorbed oxidizing agent. If necessary, a solubilizing agent, e.g. a polar organic solvent, may be included in the aqueous solution.

Various advantageous embodiments of the methods of the invention are also possible.

A pretreatment step for the nonconductor, which may occur on a circuit board, can be used in some embodiments of the present invention. For example, a manganese dioxide layer can be applied to the circuit board, which is made of an insulating material, for use as the oxidizing agent. This can occur, for example, by immersing the circuit board in a potassium permanganate solution under conditions by which a reaction occurs between the circuit board material and the permanganate on the circuit board surface. Manganese (VII) is reduced to Manganese (IV). The reaction product embeds in the pores of the nonconducting regions of the circuit board surface, or is chemically adsorbed on the circuit board surface. The nonconducting surface regions of the circuit board, particularly the interior surfaces of the through-going holes, are completely enclosed with a coating of the mild oxidizing agent, manganese dioxide, by the oxidation step to manganese (IV). This adsorbate manganese dioxide is no longer removable by rinsing or washing and comprises the oxidizing agent effective in the method according to the invention.

Circuit boards, which are pretreated according to the method of the above paragraph, can now be processed according to the basic method of the invention.

By contact of a circuit board so pretreated with an aqueous, acid solution, if necessary also containing a solubilizing agent, of a nonconducting heterocyclic substance, this substance being selected from the group consisting of 5-membered-ring-containing heterocyclic monomers, oligomers derived therefrom and mixtures thereof, an electrically conducting layer, which contains an adhering, insoluble high polymer product coating the circuit board, is formed.

The method of the invention as described above offers the following advantages:

First, the conductive polymer layer is formed in a single process step using one solution. Thus, one process step is eliminated, which improves the process regarding process costs (i.e. reduced investment expenses for the metallization plant, reduced expenses for process monitoring and disposal and storage of spent solutions).

Furthermore, the polymerization reaction occurs directly on first contact of the heterocyclic solution with the substrate surface, so that a very controlled reaction process is possible. This leads, among other things, to the consequence that the heterocyclic compounds need not be supplied or retained in the process solution to perform a polymerization in a subsequent process step. Thus in the process according to the invention an excess of monomer in solution, which does not reach the substrate surface to participate in the desired polymerization, does not lead to formation of a undesirable side-product buildup in subsequent process steps. Apart from that an unnecessary use of chemicals with the required disposal of excess chemicals is avoided.

The wetting of the substrate surface with the heterocyclic solution, which is at the heart of the process of the invention, is never described as a critical step in any of the processes described in the Literature. If in the prior art methods a surface film is to be formed on the substrate surface, which is then converted in another process step by an oxidation reaction into a conducting polymer layer, the process conditions must be set and controlled very carefully and with a high degree of accuracy to obtain a conducting layer with suitable properties.

This is not required in the process according to the present invention, since wetting with monomer and/or oligomer solution and the oxidation reaction occur in one process solution.

The use of acid solutions for formation of conductive polymer layers is an additional advantage in the process according to the invention. Because of that, in circuit board engineering particularly, the oxide film arising on the copper surfaces can be removed, so that the oxidizing action of copper II oxide cannot lead to a polymerization reaction on the copper surface.

In the method according to the invention furan, thiophene, pyrrole or their substituted derivatives can be used as 5-membered-ring-containing heterocyclics. The following can be used as derivatives of these heterocyclics: derivatives having one or two alkyl or alkylene groups at the 3, 4, or 3 and 4 positions of the heterocyclic ring and/or at the heteroatom. Particularly, the alkyl groups can be methyl, ethyl or propyl. Also halogen-substituted furanes, thiophene or pyrroles can be used, particularly the 3-chlor-,3-bromo-, 4-chloro-, 4-bromo-, 3,4-dichloro- and 3,4-dibromo- derivatives. The formyl- and carboxy-derivatives analogous to the halogen-substituted compounds can also be used. Similarly, pyrrole derivatives including N-methyl, N-ethyl-, N-vinylpyrrole and 2,2'- dipyrrole.

It is also possible to convert the corresponding heterocyclic compounds, especially pyrrole, into the corresponding oligomers with a weak acid. In an aqueous solution of the heterocyclic compound, which, if necessary, contains a solubilizing agent, contact with the weak acid occurs. These oligomerization reactions can be performed, as required, at low temperature, i.e. a temperature between room temperature and the freezing point of the solution. Similarly, it is possible to perform the reaction also at room temperature or at temperatures of around 50° C. The temperature of the oligomerization reaction influences the conductivity of the polymer materials deposited and the stability of the solution.

The weak acids used in the invention advantageously have an acid dissociation constant of between 0.01 and 0.1 for loss of a proton in water. The following weak acids can be used as acids for the oligomerization reaction: e.g., formic acid, acetic acid, propionic acid, butyric acid, oxalic acid, succinic acid, fumaric acid, maleic acid, azeliac acid, citric acid, malic acid, ascorbic acid and phosphoric acid. It is also possible to use the corresponding salts, which can generate the acid by hydrolysis in an aqueous system.

The concentration of the heterocyclic substance, i.e. the heterocyclic monomers and oligomers derived therefrom and/or mixture, in the aqueous solution amounts, advantageously, to from 0.1 to 200 g/l. A concentration in the range between 0.5 and 50 g/liter is preferred.

The circuit boards are treated in an oxidizing bath at a pH of between 1 and 14. Surfactants and other surface active substances can be used in the oxidizing bath.

When the circuit boards are processed by the methods of the invention, because of the electrical conductance of the polymer layer, metal can be deposited from an electrochemical bath on application of an electrical current. In this connection copper can be applied by an electrochemical method.

The process according to the present invention can be performed by an immersion and/or spraying method. This method is particularly suitable, when the circuit board is processed in a horizontal, continuous treatment.

The process according to the present invention is also suitable for a glass fiber metallization. Good metallization results can be attained, when alkali ions are added to a pyrrole solution. Similarly good metallization results are obtained by addition of p-phenol sulfonic acid, benzene sulfonic acid and/or benzene disulfonic acid and/or other acids with strong polarizable anions.

An acid pyrrole solution can be stabilized by the production of hydrogen in this solution. The electrochemical product of hydrogen on a cathode surface is a particularly advantageous way of doing that.

The significance of the process according to the present invention resides in its multifunctionality, i.e., on using permanganate as oxidizing agent a manganese oxide layer is formed, which roughens sufficiently the nonconducting surface, builds a very good adsorption layer made of manganese dioxide and simultaneously prepares the oxidizing agent for the polymerization.

The method of the invention can be used in the following embodiment for making the through-going contacts in circuit boards:

1. Production of an oxidizing layer on the nonconducting regions of the through-going holes, e.g. by action of an alkaline potassium permanganate solution. This treatment step can be preceded by several different pretreatment steps, which, for example, can serve for preparation of the resin surface for efficient formation of an oxidizing layer (e.g. manganese dioxide).

2. Action of the solution of heterocyclic compounds according to the invention on the substrate surface with formation of the conducting polymer layer or product in an acid solution.

3. Galvanic metallization. This process step can be preceded by additional pretreatment steps in a variety of pretreatment baths, which, for example, are used for copper surface cleaning.

3a. Galvanic coppering over the entire surface of the circuit board until a layer thickness of about 5 micrometers is reached. Subsequently a photoimpression is developed using the conventional technology, which involves conductive strip formation (copper and e.g. an etching resist), in which some areas are free of the built up layer depending on the pattern of the photo-impression and the removal of a photoresist, the etching and, if needed, the removal of an etching resist. These process steps can be varied also according to the requirements of the particular situation.

3b. Galvanic coppering over the entire surface on the whole circuit board until a layer thickness of about 30 micrometers. Subsequently, a photoimpression is provided according to the conventional technology, which involves an etching process and removal of an etching resist. This process sequence can be varied according to the requirements of the particular situation.

3c. The photoimpression occurs prior to the galvanic coppering. Subsequently, a layer thickness of up to about 30 micrometers is built up by metallizing and, if necessary, an etching resist is formed. The removal of the metallic etching resist occurs after that. These process steps can be changed according to the requirements of the particular situation.

Prior to the galvanic coppering a pretreatment in another solution, which contains the acid and/or the oxidizing agent, occurs to attain a sufficient conductivity of the polymer layer. For that, for example, a sulfuric acid/sodium persulfate solution can be used.

Understandably other embodiments of the invention as described above are conceivable. The following Examples serve to illustrate the invention, but should not be construed as limiting the invention as set forth in the appended claims.

EXAMPLE 1

Solution I.

A solution I was prepared by dissolving 20 ml pyrrole in 110 ml of a mixture of ethylene glycol monobutyl ether and isopropanol and adding 70 ml of water and 10 g of dichloroacetic acid (K=0.0332).

The solution I changed color from yellow to green in a few minutes. Precipitates were not observed.

Nonconductor Treatment

An epoxy resin board was treated as follows:

1. Swelling in a solution with N-methyl pyrrolidone;
2. Rinsing with water;
3. Etching in an alkaline permanganate solution;
4. Rinsing in a stationary rinse with water;
5. Washing with water;
6. Immersing for 5 minutes at 20° C. in solution I;
7. Rinsing with water; and
8. Drying of the board with warm air.

The electric resistance amounts to about 28 kOhm.

EXAMPLE 2

An epoxy resin board was treated as in Example 1 and after rinsing in water (step 7) was coppered in an acid galvanic copper electrolyte. The current density amounted to about 2 A/qdm. The layer was completely coppered after about 5 minutes.

EXAMPLE 3

Solution II

Solution II was prepared by dissolving 70 ml of N-Methylpyrrolidone and mixing with 110 ml water and 10 g oxalic acid (K=0,059).

This solution became green in color after a few hours. No precipitate was observed.

An epoxy resin board was treated as described in Example 1 (Steps 1 to 5) and then treated in solution II (Step 6) for 5 minutes. After rinsing in water, it was dried. After drying, the resistance of the polypyrrole layer amounted to 35 kOhm.

EXAMPLE 4

A circuit board coated with copper on both sides and provided with through-going holes was pretreated as described in Example 1 with steps 1 to 5 only and subsequently was treated in solution II for 5 minutes. After rinsing in water, the board was coppered galvanically for a short time.

The through-going hole walls were coppered satisfactorily after only 5 minutes of galvanic treatment.

EXAMPLE 5

A fresh solution was made up comprising 25 ml pyrrole, 15 ml phosphoric acid (85%) and 950 ml water. An epoxy resin board, which was pretreated with an alkaline potassium permanganate solution, was treated using the fresh solution. A conducting polypyrrole was deposited from the solution on the epoxy resin board.

The resistance of the polymeric layer amounted to from 5 to 6 kOhm. The layer could be coppered galvanically without imperfections or defects formed. The current density used was 4 A/dm.

EXAMPLE 6

Polypyrrole, after pretreatment as in Example 5, was deposited on an epoxy resin circuit board from a 24 hour old solution made from 25 ml pyrrole, 25 ml phosphoric acid (85%) and 950 ml water. The resistance of the polymeric layer amounts to about 700 kOhm. The layer could no longer be galvanically coppered.

EXAMPLE 7

Hydrogen was developed electrolytically and a noble steel net in a solution made of 25 ml pyrrole, 25 ml phosphoric acid (85%) and 950 ml of water. The anode chamber was separated electrolytically from this cathode.

An epoxy resin board, which was pretreated according to Example 1 (including steps 1 to 5 only), was coated for 48 hours in the solution prepared electrolytically with polypyrrole. The polymeric layer had a resistance of about 105 kOhm. Galvanic coppering proceeded satisfactorily.

EXAMPLE 8

A conductive polymer was deposited on an epoxy resin board, which was pretreated according to Example 1 (steps 1 to 5 only) from a solution containing 7.5 g pyrrole, 990 ml water and phosphoric acid(which was added until the pH was 2.5).

The resistance of the polymer layer amounted to from 150 to 200 kOhm. The layer can be galvanically reinforced(4A/dm). The solution was stabilized. It could produce the same type of layers equally well even after standing for a week.

EXAMPLE 9

A conductive polymer was deposited on an epoxy resin board, which was pretreated according to Example 1 (steps 1 to 5 only) from a solution containing 7.5 g pyrrole, 990 ml water and phosphoric acid (which was added until the pH was 3.5).

The resistance of the polymer layer amounted to 6500 kOhm. The layer could not be galvanically reinforced. The solution was stabilized.

EXAMPLE 10

A conductive polymer was deposited on an epoxy resin board, which was pretreated according to Example 1 (steps 1 to 5 only) from a solution containing 7.5 g pyrrole, 5.0 g disodium hydrogen phosphate crystals, 5.0 g sodium hydrogen phosphate crystals, 980 ml water and phosphoric acid (which was added until the pH was 2.5).

The resistance of the polymer layer amounted to from 30 to 45 kOhm. The layer was galvanically reinforced in a short time (4A/dm). The conductive polymer could be deposited over a week long in this solution without increasing the resistance of the polypyrrole layer.

EXAMPLE 11

A conductive polymer was deposited on an epoxy resin board, which was pretreated according to Example 1 (steps 1 to 5 only) from a solution containing 7.5 g pyrrole, 25.0 g dipotassium hydrogen phosphate, 25.0 g potassium hydrogen phosphate crystals, 960 ml water and phosphoric acid (which was added until the pH was 2.5).

The resistance of the polymer layer amounted to from 10 to 15 kOhm. The layer was galvanically reinforced in a few minutes time (4A/dm). The solution of this example was stable, so that, after one week standing time, it could be used to produce a satisfactory conducting polypyrrole layer.

EXAMPLE 12

A conductive polymer was deposited at room temperature on the interior surfaces of the through-going holes of an epoxy resin board, which was pretreated according to Example 1 (steps 1 to 5 only) from a solution containing 7.5 g pyrrole per liter. Then the through-going holes were coppered galvanically. Also after four days after the preparation of this solution equally good results were obtained in regard to the coverage of the through-going holes as were obtained directly after preparation of the solution. However, when another attempt to use this solution after six days was made, a coating of the through-going hole interior surfaces which was inferior resulted.

EXAMPLE 13

The same experiment as in Example 12 was preformed at +5° C. In this case good metallization results are obtained even after twelve days of standing time for the solution.

While the invention has been illustrated and described as embodied in a method of metallizing a nonconductor, it is not intended to be limited to the details shown, since various modifications and chemical changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and desired to be protected by Letters Patent is set forth in the appended claims:

1. A process for directly metallizing a nonconductor surface, comprising:

forming an adsorption layer on the nonconductor surface by reacting an oxidizing agent therewith; and depositing an adherent, insoluble polymer product on the nonconductor surface from an aqueous solution containing a weak acid and a heterocyclic substance, said weak acid being one of an acid having an acid dissociation constant between 0.01 and 0.1 for loss of a proton in water and an acid selected from the group consisting of formic acid, acetic acid, propionic acid, butyric acid, oxalic acid, succinic acid, fumaric acid, maleic acid, azelaic acid, citric acid, malic acid, ascorbic acid and phosphoric acid by contacting the aqueous solution with the adsorption layer wherein the aqueous solution reacts with the adsoption layer such that the adsorption layer is consumed and the polymer product is deposited on the nonconductor surface, the polymer product having an electrical conductance which is sufficient for electroplating a metal on the polymer product, said weak acid preventing polymerization reactions of said heterocyclic substance with itself in the aqueous solution.

2. The process according to claim 1, wherein the aqueous solution also contains a solubilizing agent.

3. The process according to claim 2, in which the solubilizing agent is a polar organic solvent.

4. The process according to claim 1, wherein the heterocyclic substance is a 5-membered-heterocyclic-ring-containing monomer selected from the group consisting of furan, pyrrole and thiophene.

5. The process according to claim 1, wherein the aqueous solution contains 0.1 to 200 g/l of the heterocyclic substance.

6. The process according to claim 1, wherein the forming step includes reacting a permanganate with the nonconductor surface to provide the adsorption layer of manganese dioxide.

7. The process according to claim 1, further comprising metallizing the polymer product with a galvanic acid copper bath.

8. The process according to claim 1, wherein the nonconductor surface defines a plurality of through-going holes having interior surfaces, said process further including metallizing the interior surfaces of the holes.

9. The process according to claim 1, wherein the aqueous solution is contacted with the adsorption layer by immersing the nonconductor surface in said solution.

10. The process according to claim 1, wherein the heterocyclic substance is selected from the group consisting of 5-membered-heterocyclic-ring-containing monomers, oligomers derived therefrom, and mixtures thereof.

11. The process according to claim 1, wherein the heterocyclic substance is a 5-membered-heterocyclic-ring-containing monomer selected from the group consisting of furan derivatives, pyrrole derivatives and thiophene derivatives.

* * * * *